United States Patent
Yuan

(10) Patent No.: US 11,333,922 B2
(45) Date of Patent: May 17, 2022

(54) DISPLAY PANEL, METHOD FOR FABRICATING THE SAME, AND DISPLAY DEVICE

(71) Applicants: Ordos Yuansheng Optoelectronics Co., Ltd., Inner Mongolia (CN); BOE Technology Group Co., Ltd., Beijing (CN)

(72) Inventor: Yu Yuan, Beijing (CN)

(73) Assignees: Ordos Yuansheng Optoelectronics Co., Ltd., Inner Mongolia (CN); BOE Technology Group Co., Ltd., Beijing (CN)

(*) Notice: Subject to any disclaimer, the term of this patent is extended or adjusted under 35 U.S.C. 154(b) by 106 days.

(21) Appl. No.: 16/621,298

(22) PCT Filed: Mar. 29, 2019

(86) PCT No.: PCT/CN2019/080302
§ 371 (c)(1),
(2) Date: Dec. 11, 2019

(87) PCT Pub. No.: WO2019/228046
PCT Pub. Date: Dec. 5, 2019

(65) Prior Publication Data
US 2020/0117047 A1    Apr. 16, 2020

(30) Foreign Application Priority Data

May 30, 2018    (CN) .......................... 201810539268.0

(51) Int. Cl.
*G02F 1/1333*    (2006.01)
*G02F 1/1335*    (2006.01)
(Continued)

(52) U.S. Cl.
CPC ....... *G02F 1/133514* (2013.01); *G02B 5/201* (2013.01); *G02B 5/26* (2013.01);
(Continued)

(58) Field of Classification Search
CPC ......... G02F 1/133514; G02F 1/133521; G02F 1/1333; G02F 1/1335; G02B 5/26;
(Continued)

(56) References Cited

U.S. PATENT DOCUMENTS

2003/0127968 A1* 7/2003 Kuma ................... H01L 27/322
                                                          313/503
2005/0212993 A1* 9/2005 Lazarev ............ G02F 1/133536
                                                          349/62

(Continued)

FOREIGN PATENT DOCUMENTS

CN        103091758 A      5/2013
CN        203259680 U     10/2013
(Continued)

OTHER PUBLICATIONS

Chinese First Office Action issued in corresponding Chinese Application No. 201810539268.0 dated Sep. 2, 2019.

*Primary Examiner* — Balram T Parbadia
(74) *Attorney, Agent, or Firm* — ArentFox Schiff LLP; Michael Fainberg

(57) ABSTRACT

A display panel, a method for fabricating the same, and a display device are provided. The display panel includes: a first substrate, and a plurality of pixels in an array on the first substrate, where each pixel includes a plurality of sub-pixels in different colors, and interference filters one-to-one corresponding to the sub-pixels are arranged on light emitting sides of the sub-pixels, and configured to transmit light in narrow bands in the same colors as the corresponding sub-pixels. The interference filters corresponding to the (Continued)

colors of light emitted from the sub-pixels are arranged on the light emitting sides of the sub-pixels so that the light in the narrow bands in the corresponding colors are transmitted, thus improving the saturation of the colors of the emitted light, extending the display color gamut of the display panel, and optimizing the display effect.

20 Claims, 5 Drawing Sheets

(51) Int. Cl.
| | | |
|---|---|---|
| *H01L 27/32* | (2006.01) | |
| *H01L 51/52* | (2006.01) | |
| *H01L 51/56* | (2006.01) | |
| *G02B 5/26* | (2006.01) | |
| *G02B 5/20* | (2006.01) | |
| *G02B 5/28* | (2006.01) | |

(52) U.S. Cl.
CPC ............... *G02B 5/28* (2013.01); *G02B 5/288* (2013.01); *H01L 27/3211* (2013.01); *H01L 27/3244* (2013.01); *H01L 51/5271* (2013.01); *H01L 51/56* (2013.01); *G02F 1/133521* (2021.01)

(58) Field of Classification Search
CPC .......... G02B 5/201; G02B 5/288; G02B 5/28; H01L 27/3244; H01L 27/3211; H01L 51/5271; H01L 51/56; H01L 27/322; H01L 27/32; H01L 51/52
See application file for complete search history.

(56) References Cited

U.S. PATENT DOCUMENTS

| | | | |
|---|---|---|---|
| 2005/0270443 A1* | 12/2005 | Lin | G02F 1/133514 349/108 |
| 2007/0217045 A1* | 9/2007 | Chen | G02B 5/28 359/891 |
| 2007/0257609 A1* | 11/2007 | Fukuda | H01L 51/5284 313/506 |
| 2008/0224968 A1* | 9/2008 | Kashiwabara | H01L 27/3213 345/83 |
| 2010/0053043 A1 | 3/2010 | Sakamoto | |
| 2010/0314638 A1* | 12/2010 | Fukuda | H01L 51/5265 257/89 |
| 2011/0042696 A1* | 2/2011 | Smith | H01L 51/5231 257/89 |
| 2013/0021556 A1* | 1/2013 | Nagato | G02F 1/133509 349/62 |
| 2013/0188253 A1* | 7/2013 | Nakai | G02F 1/133514 359/584 |
| 2013/0242237 A1* | 9/2013 | Nagato | G02F 1/133509 349/105 |
| 2014/0285753 A1* | 9/2014 | Nagato | G02F 1/133514 349/96 |
| 2014/0340620 A1 | 11/2014 | Zhang et al. | |
| 2015/0155346 A1* | 6/2015 | Motoyama | H01L 27/322 257/89 |
| 2016/0212414 A1* | 7/2016 | Chen | G02B 30/27 |
| 2017/0236881 A1 | 8/2017 | Shen et al. | |
| 2017/0331065 A1* | 11/2017 | Seo | H01L 27/323 |
| 2018/0358578 A1 | 12/2018 | Li et al. | |
| 2020/0117047 A1 | 4/2020 | Yuan | |

FOREIGN PATENT DOCUMENTS

| | | |
|---|---|---|
| CN | 104409468 A | 3/2015 |
| CN | 105489632 A | 4/2016 |
| CN | 108735788 A | 11/2018 |

* cited by examiner

DISPLAY PANEL, METHOD FOR FABRICATING THE SAME, AND DISPLAY DEVICE

This application is a US National Stage of International Application No. PCT/CN2019/080302, filed Mar. 29, 2019, which claims priority to Chinese Patent Application No. 201810539268.0, filed with the Chinese Patent Office on May 30, 2018, and entitled "Display panel, Method for fabricating the same, and Display device", which is hereby incorporated by reference in its entirety.

FIELD

This disclosure relates to the field of display technologies, and particularly to a display panel, a method for fabricating the same, and a display device.

BACKGROUND

As the age of information is coming, legacy cathode ray tube displays have been superseded by flat panel displays, and one of the most popular existing flat panel displays is a Liquid Crystal Display (LCD), and the LCD has been well developed at a low cost. A display panel of the LCD generally includes an array substrate, a color filter substrate, and a liquid crystal layer located between the two substrates, where input signals to Thin Film Transistors (TFTs) on the array substrate are controlled to thereby change the rotation direction of liquid crystal molecules so as to control brightness of light emitted from the pixels, and the color of the emitted light is selected using a color filter layer so that an image is displayed.

An Organic Light-Emitting Diode (OLED) among the next generation of display technologies emits light by itself, has a wide angle of view, a short response time, high light-emission efficiency, and low operating voltage, a thin display panel can be fabricated using the OLEDs, and a flexible display device with a large size can be fabricated using the OLEDs, so the OLED has been widely favored in the field of display technologies. The OLED includes a light emitting layer made of an organic light-emitting material, where holes of a positive electrode, and electrons of a negative electrode can be combined into photons at the light emitting layer under the action of an electric field. Light in different colors can be generated by selecting different light-emitting materials so that an image is displayed.

However the existing all-color display panels, e.g., the LCD and OLED display panels above, generally suffer from low saturations, and consequentially a narrow display color gamut, so it is desirable to improve their display effect.

SUMMARY

Embodiments of this disclosure provide a display panel, a method for fabricating the same, and a display device so as to improve the saturation and the display effect of the display panel.

In a first aspect, an embodiment of this disclosure provides a display panel. The display panel includes: a first substrate; a plurality of pixels in an array on the first substrate, wherein at least one of the pixels includes at least two sub-pixels in different colors; and interference filters one-to-one corresponding to the sub-pixels on light emitting sides of the sub-pixels, and configured to transmit light in narrow bands in same colors as the corresponding sub-pixels.

In a possible implementation, in the display panel above according to the embodiment of this disclosure, the interference filter is a band-pass filter with a pass band below 5% of a center wavelength.

In a possible implementation, in the display panel above according to the embodiment of this disclosure, the interference filter includes two reflecting layers opposite to each other, and a spacing layer between the two reflecting layers.

In a possible implementation, in the display panel above according to the embodiment of this disclosure, the reflecting layer includes a first dielectric layer and a second dielectric layer stacked alternately, and a refractive index of the first dielectric layer is lower than a refractive index of the second dielectric layer.

In a possible implementation, in the display panel above according to the embodiment of this disclosure, the spacing layer, and the center wavelength of the interference filter satisfy the following relationship:

$$nd = x\frac{\lambda_0}{2};$$

wherein n is the refractive index of the spacing layer, d is a geometrical thickness of the spacing layer, $\lambda_0$ is the center wavelength of the interference filter, and x is an integer equal to or more than 1.

In a possible implementation, in the display panel above according to the embodiment of this disclosure, the material of the first dielectric layer is silicon oxide, and the material of the second dielectric layer is silicon nitride.

In a possible implementation, in the display panel above according to the embodiment of this disclosure, the refractive index of the spacing layer is equal to the refractive index of the first dielectric layer, the pass band of the interference filter satisfies the following relationship:

$$\frac{\Delta\lambda}{\lambda_0} = \frac{4n_0 n_L^{2q}(n_H - n_L)}{m\pi n_H^{2q-1}(n_H - n_L + n_L/m)};$$

wherein $2\Delta\lambda$ is the full width at half maximum of the interference filter, $n_0$ is the refractive index of a medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

In a possible implementation, in the display panel above according to the embodiment of this disclosure, the refractive index of the spacing layer is equal to the refractive index of the second dielectric layer, the pass band of the interference filter satisfies the following relationship:

$$\frac{\Delta\lambda}{\lambda_0} = \frac{4n_0 n_L^{2q-1}(n_H - n_L)}{m\pi n_H^{2q}(n_H - n_L + n_L/m)};$$

wherein $2\Delta\lambda$ is the full width at half maximum of the interference filter, no is the refractive index of a medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

In a possible implementation, in the display panel above according to the embodiment of this disclosure, the display panel is a liquid crystal display panel, and the liquid crystal display panel further includes a second substrate opposite to the first substrate, and the interference filters one-to-one corresponding to the sub-pixels are on the side of the second substrate facing the first substrate.

In a possible implementation, in the display panel above according to the embodiment of this disclosure, the display panel is an organic light-emitting diode display panel.

In a possible implementation, in the display panel above according to the embodiment of this disclosure, the organic light-emitting diode display panel further includes a protective cover plate opposite to the first substrate, and the interference filters one-to-one corresponding to the sub-pixels are on the side of the protective cover plate facing the first substrate.

In a possible implementation, in the display panel above according to the embodiment of this disclosure, the organic light-emitting diode display panel further includes a light-emitting element encapsulation layer on the first substrate, and the interference filters one-to-one corresponding to the sub-pixels are on the side of the encapsulation layer away from the first substrate.

In a second aspect, an embodiment of this disclosure provides a display device including the display panel according to any one of the implementations above.

In a third aspect, an embodiment of this disclosure provides a method for fabricating the display panel above, the method including:

preparing a first substrate;

forming a plurality of pixels in an array on the first substrate, wherein at least one of the pixels includes a plurality of sub-pixels in different colors; and forming the interference filters one-to-one corresponding to the sub-pixels on the light emitting sides of the sub-pixels, where the interference filters are configured to transmit light in narrow bands in the same colors as the corresponding sub-pixels.

In a possible implementation, in the method above according to the embodiment of this disclosure, when the display panel is a liquid crystal display panel, forming the interference filters one-to-one corresponding to the sub-pixels on the light emitting sides of the sub-pixels includes:

preparing a second substrate;

forming the interference filters corresponding to the sub-pixels in the different colors successively on the second substrate; and aligning the second substrate formed with the interference filters with the first substrate so that the interference filters face the corresponding sub-pixels.

In a possible implementation, in the method above according to the embodiment of this disclosure, when the display panel is an organic light-emitting diode display panel, forming the interference filters one-to-one corresponding to the sub-pixels on the light emitting sides of the sub-pixels includes:

preparing a protective cover plate;

forming the interference filters corresponding to the sub-pixels in the different colors successively on the protective cover plate; and arranging the protective cover plate formed with the interference filters on the light emitting sides of the sub-pixels so that the interference filters face the corresponding sub-pixels.

Advantageous effects of this disclosure are as follows.

In the display panel, the method for fabricating the display panel, and the display device according to the embodiments of this disclosure, the display panel includes: a first substrate, and a plurality of pixels in an array on the first substrate, where each pixel includes a plurality of sub-pixels in different colors, and interference filters one-to-one corresponding to the sub-pixels are arranged on light emitting sides of the sub-pixels, and configured to transmit light in narrow bands in the same colors as the corresponding sub-pixels. The interference filters corresponding to the colors of light emitted from the sub-pixels are arranged on the light emitting sides of the sub-pixels so that the light in the narrow bands in the corresponding colors are transmitted, thus improving the saturation of the colors of the emitted light, extending the display color gamut of the display panel, and optimizing the display effect.

DETAILED DESCRIPTION

Figure 1:
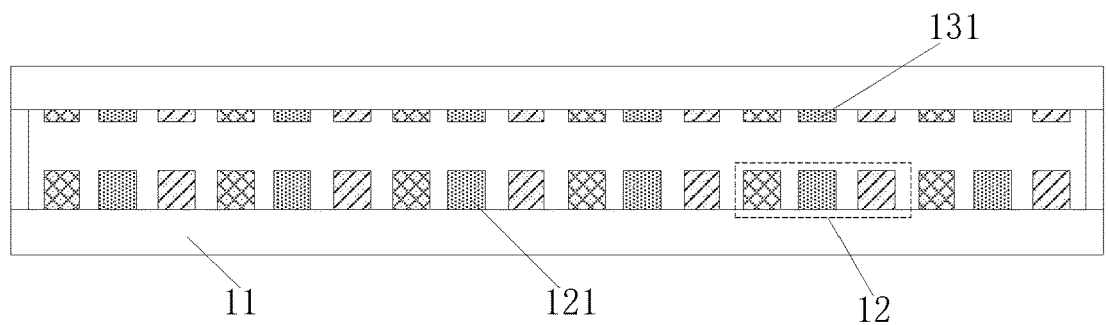
FIG. 1 is a schematic structural diagram of a display panel according to an embodiment of this disclosure.

In view of the problem in the prior art, the embodiments of this disclosure provide a display panel, a method for fabricating the same, and a display device so as to improve the color saturation and the display effect of the display panel.

Implementations of the display panel and the display device according to the embodiments of this disclosure will be described below in details. The thicknesses and shapes of respective layers in the drawings are not intended to reflect any real proportion, but only intended to illustrate this disclosure.

As illustrated in FIG. 1, an embodiment of this disclosure provides a display panel. The display panel includes: a first substrate 11, and a plurality of pixels 12 in an array on the first substrate 11, where each pixel 12 includes at least two sub-pixels 121 in different colors, and interference filters 131 one-to-one corresponding to the sub-pixels 121 are arranged on light-emitting sides of the sub-pixels, and the interference filters 131 are configured to transmit light in narrow bands in the same colors as the corresponding sub-pixels 121.

In a real application, the interference filters above can be band-pass filters, and the interference filter corresponding to the color of transmission light of the sub-pixel is arranged for each sub-pixel in different color, and the interference filter is configured to only allow transmission of such light among the light emitted from the corresponding sub-pixel that lies in narrow band around the center wavelength of the emitted light. The narrow band refers to such a band that the ratio of the full width at half maximum of the transmitted light to the center wavelength is no more than 5%, that is, the pass band of the interference filter is no more than 5% of the center wavelength so that there may be a sharp peak of the transmitted light at the center wavelength to thereby improve the purity of the color of the emitted light. The display panel includes the sub-pixels emitting light in different primary colors, and the interference filters corresponding to the sub-pixels emitting the light in the different primary colors are arranged respectively for the sub-pixels so that the purities of the light in the primary colors emitted from the display panel can be improved to thereby improve the color saturation of the display panel, and extend the color gamut of the display panel.

For example, the display panel can include red sub-pixels, green sub-pixels, and blue sub-pixels, and these three types of sub-pixels correspond respectively red light interference filters transmitting red light, green light interference filters transmitting green light, and blue light interference filters transmitting blue light. The transmitted light center wavelength of the red interference filter is 700 nm, the transmitted light center wavelength of the blue interference filter is 546 nm, and the transmitted light center wavelength of the blue interference filter is 435 nm. The ratios of transmitted light full widths at half maximums of the interference filters in the different colors to their center wavelengths are no more than 5% so that they filter the light in the corresponding colors in a narrow band pass manner. Additionally the display panel further includes yellow sub-pixels in addition to the red sub-pixels, the green sub-pixels, and the blue sub-pixels, and corresponding yellow light interference filters are also arranged for the yellow sub-pixels to transmit yellow light. When the display panel includes sub-pixels in one or more other colors, interference filters can be similarly arranged for the sub-pixels, and in a specific implementation, the interference filters can be arranged in reality. The types of sub-pixels, and the transmitted light bands of the interference filters in the display panel will not be limited to any specific types of sub-pixels, and specific bands.

Figure 2:
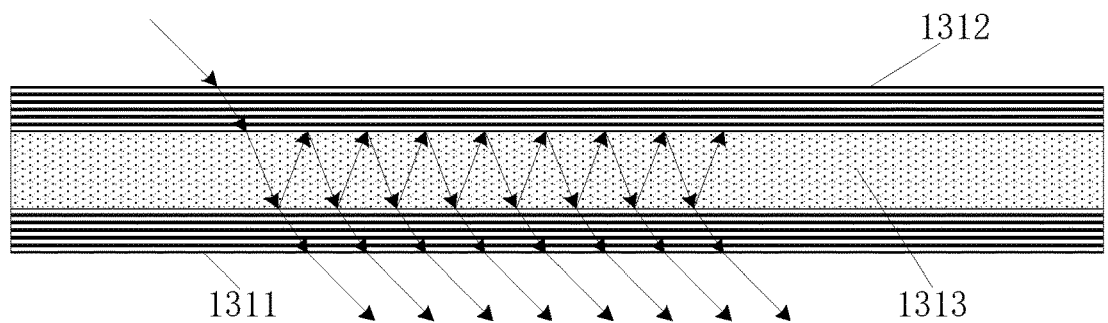
FIG. 2 is a schematic structural diagram of an interference filter according to an embodiment of this disclosure.
Figure 3:
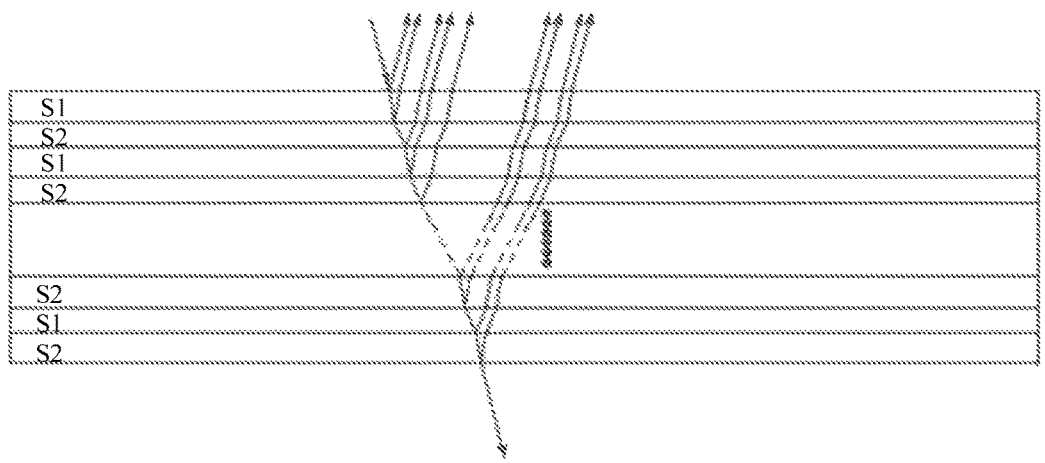
FIG. 3 is a schematic structural diagram of a reflecting layer according to an embodiment of this disclosure.

Furthermore as illustrated in FIG. 2, the interference filter 131 according to the embodiment of this disclosure includes two reflecting layers 1311 and 1312 opposite to each other, and a spacing layer 1313 located between the two reflecting layers. As illustrated in FIG. 3, each reflecting layer 1311 and 1312 includes a first dielectric layer S1 and a second dielectric layer S2 stacked alternately, and a refractive index of the first dielectric layer S1 is lower than a refractive index of the second dielectric layer S2.

Under the principle of a reflectivity-enhancing film, in the embodiment of this disclosure, the reflecting layer is provided with two different dielectric material layers stacked, so that there is a half-wavelength loss of light propagated from a dielectric layer with a lower refractive index to a dielectric layer with a high refractive index, and when the geometrical thicknesses of the respective dielectric layers are set to $\lambda_0/4$, then the optical path difference between two beams of light reflected on two surfaces of the dielectric layer is an integer multiple of $\lambda_0$, so the reflected light are coherently enhanced to thereby improve the reflectivity as illustrated in FIG. 3.

The spacing layer is arranged between the two symmetric reflecting layers, thus resulting in a Fabry-Perot interference structure, and in this way, the spacing layer is equivalent to a resonance cavity in which light oscillates stably, and the resonance condition can be satisfied when the phase difference between a light wave and the light wave after traveling in a round trip in the resonance cavity is an integer multiple of $2\pi$, so only a light wave at a specific frequency (i.e., a specific wavelength) can have the highest transmittivity in the resonance cavity. The wavelength of the light at the specific frequency is a center wavelength of an interference filter, and can satisfy the following relationship:

$$nd = x\frac{\lambda_0}{2}.$$

Where n is the refractive index of the spacing layer, d is the geometrical thickness of the spacing layer, $\lambda_0$ is the center wavelength of the interference filter, and x is an integer equal to or more than 1.

Apparently the center wavelength of transmitted light is determined as a function of the refractive index and the geometrical thickness of the spacing layer. Given the material of the spacing layer, the center wavelength is determined as a function of the thickness of the spacing layer. The spacing layer made of the same material can be provided with a different thickness for a high transmittivity thereof to light in a different color.

In a specific implementation, the material of the first dielectric layer S1 can be silicon oxide, and the material of the second dielectric layer S2 can be silicon nitride. The refractive index of silicon oxide is lower than the refractive index of silicon nitride, where the refractive index of silicon nitride can be changed by changing the content of nitrogen thereof, and the refractive index of silicon nitride (SiNx) rises as the content of nitrogen thereof drops. Additionally the first dielectric layer and the second dielectric layer can alternatively be made of other materials with a higher refractive index than 1, although the embodiment of this disclosure will not be limited thereto.

In a real application, the spacing layer 1313 can be made of the same material as the first dielectric layer S1, or can be made of the same material as the second dielectric layer S2. There is also a different pass band of the interference filter when the spacing layer made of a different material.

When the spacing layer 1313 is made of the same material as the first dielectric layer S1, that is, the refractive index of the spacing layer 1313 is equal to the refractive index of the first dielectric layer S1, the pass band of the interference filter satisfies the following relationship:

$$\frac{\Delta\lambda}{\lambda_0} = \frac{4n_0 n_L^{2q}(n_H - n_L)}{m\pi n_H^{2q-1}(n_H - n_L + n_L/m)}.$$

Where $2\Delta\lambda$ is the full width at half maximum of the interference filter, no is the refractive index of the medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

When the spacing layer 1313 is made of the same material as the second dielectric layer S2, that is, the refractive index of the spacing layer 1313 is equal to the refractive index of the second dielectric layer S2, the pass band of the interference filter satisfies the following relationship:

$$\frac{\Delta\lambda}{\lambda_0} = \frac{4n_0 n_L^{2q-1}(n_H - n_L)}{m\pi n_H^{2q}(n_H - n_L + n_L/m)}.$$

Where $2\Delta\lambda$ is the full width at half maximum of the interference filter, no is the refractive index of a medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

For the interference filter as arranged above, the refractive index $n_L$ of the refractive index of the first dielectric layer S1, the refractive index $n_H$ of the second dielectric layer S2, and the number q of second dielectric layers in the reflecting layer can be adjusted to thereby adjust the full width at half maximum so as to filter light in different colors as needed.

Figure 4:
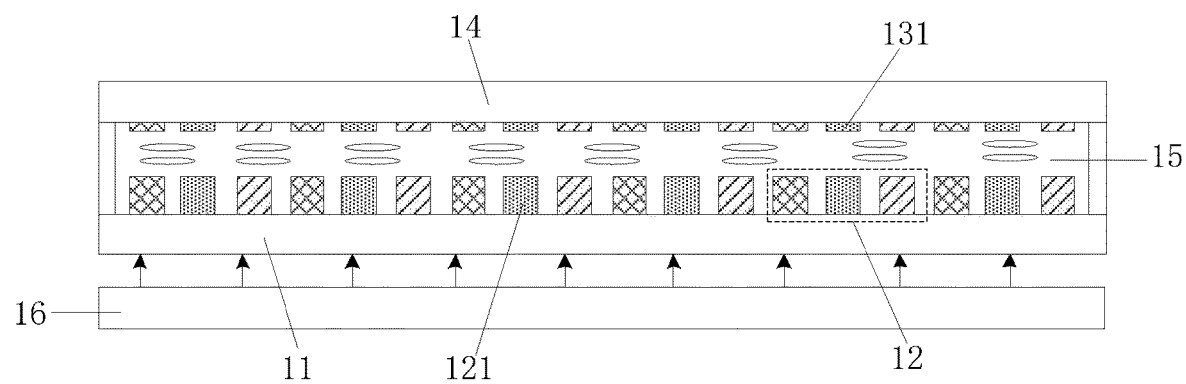
FIG. 4 is a schematic structural diagram of a display panel according to another embodiment of this disclosure.

The interference filter above according to the embodiment of this disclosure can be applicable to different types of display panels. In an optional implementation, the display panel can be a liquid crystal display panel. As illustrated in FIG. 4, the liquid crystal display panel can include a second substrate 14 arranged opposite to the first substrate 11, where the interference filters 131 one-to-one corresponding to the sub-pixels 121 are arranged on the side of the second substrate 14 facing the first substrate 11. In the liquid crystal display panel, the first substrate 11 can be an array substrate, and the second substrate 14 can be a color filter substrate; and the liquid crystal display panel, can further include a liquid crystal layer 15 located between the first substrate 11 and the second substrate 14. The display device including the liquid crystal display panel above typically further includes a backlight module 16 as illustrated in FIG. 4, the backlight module 16 is configured to provide the liquid crystal display panel with backlight. Gate lines and data lines on the array substrate are arranged to cross with each other to define the position of each of the sub-pixels, and the interference filters one-to-one corresponding to the sub-pixels are arranged respectively above the sub-pixels, where the types of the interference filters correspond to the primary colors of the light. The backlight module can emit white backlight, and after the backlight is incident on the interference filter through the liquid crystal layer, it is filtered by the interference filter so that only narrowband light in some primary color is transmitted.

In another implementation, the display panel can be an organic light-emitting diode display panel, and the interference filters in the organic light-emitting diode display panel can be arranged in one of the following two positions.

Figure 5:
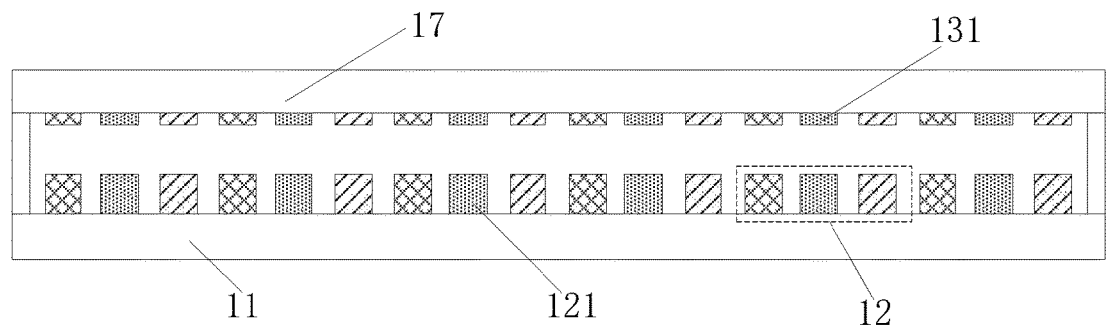
FIG. 5 is a schematic structural diagram of a display panel according to another embodiment of this disclosure.

In first position, when the organic light-emitting diode display panel is encapsulated with a cover plate, and as illustrated in FIG. 5, the organic light emitting diode display panel can include: a protective cover plate 17 which is opposite to the first substrate 11, where the interference filters 131 one-to-one corresponding to the sub-pixels 121 are on the side of the protective cover plate 17 facing the first substrate 11.

When the organic light-emitting diode display panel is encapsulated with a cover plate, the interference filters can be formed inside the cover plate. The organic light-emitting diode display panel includes a plurality of sub-pixels, each sub-pixel includes an anode, a light-emitting layer, a cathode stacked on the first substrate. The sub-pixel can emit light in different color due to different material of the light-emitting layer. The embodiments of the disclosure can apply to the organic light-emitting diode emitting white light combined with the interference filters, or apply to the organic light-emitting diode emitting color light combined with the interference filters. The interference filter can be arranged to perform narrow band pass filtering on light in different primary colors, to thereby improve the color gamut of the display panel.

Figure 6:
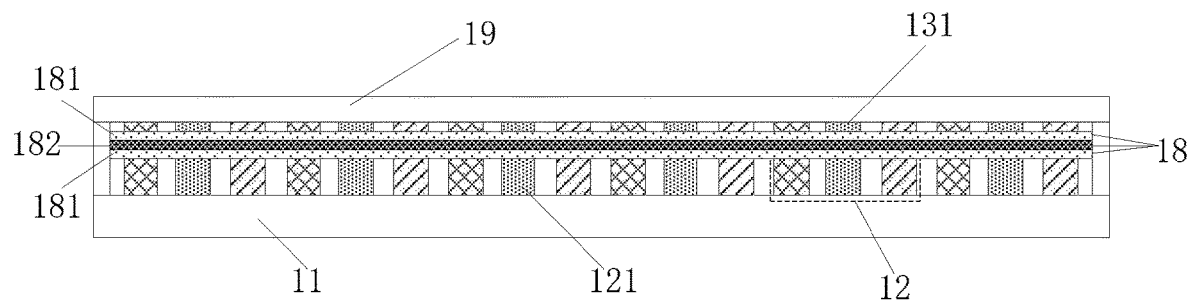
FIG. 6 is a schematic structural diagram of a display panel according to another embodiment of this disclosure.

In second position, the organic light-emitting diode display panel is encapsulated with a thin film, and as illustrated in FIG. 6, the organic light-emitting diode display panel can include: an encapsulation layer 18 on the first substrate 11 and configured to encapsulate the light-emitting element. The interference filters 131 one-to-one corresponding to the sub-pixels 121 are on the side of the encapsulation layer 18 away from the first substrate 11. The encapsulation layer includes an inorganic layer 181 and an organic layer 182, the inorganic layer 181 is arranged adjacent to the light-emitting elements of the sub-pixels to effectively block external water and oxygen; the organic layer 182 is arranged to improve the flexibility of the display panel. After the organic light-emitting diode elements are encapsulated by the thin film, the interference filters can be formed thereon to perform narrow band pass filtering on light in different primary colors, to thereby improve the color gamut of the display. Thereafter a protective layer 19 can be formed on the interference filters to protect the interference filters from being damaged.

Based upon the same idea, an embodiment of this disclosure provides a display device including the display panel above. The display device can be applicable to a phone, a tablet computer, a TV set, a display, a notebook computer, a digital photo frame, a navigator, or any other product or component with a display function. Since the display device addresses the problem under a similar principle to the display panel above, reference can be made to the implementation of the display panel for an implementation of the display device, so a repeated description thereof will be omitted here.

Figure 7:
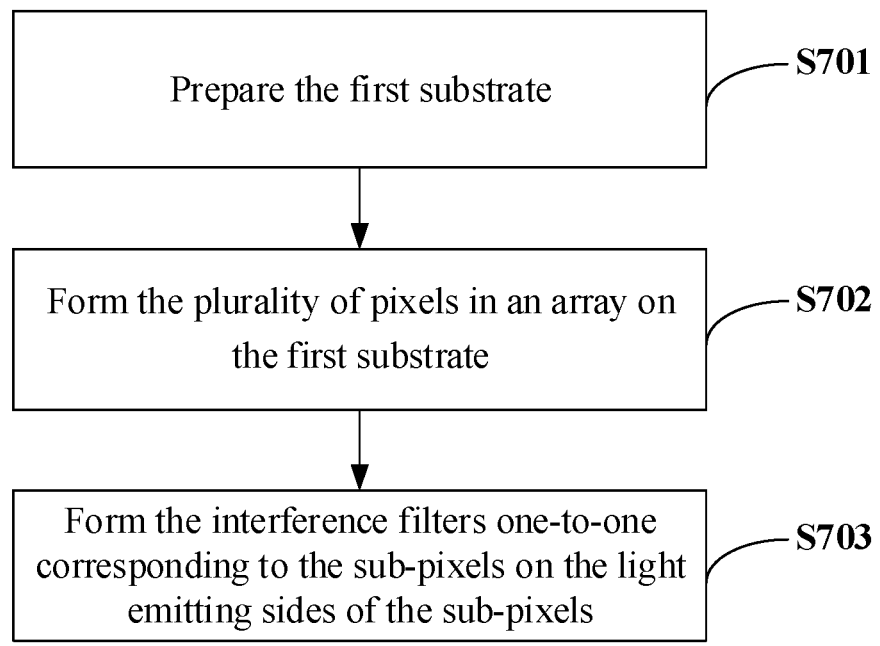
FIG. 7 is a flow chart of a method for fabricating a display panel according to an embodiment of this disclosure.

In another aspect, an embodiment of this disclosure further provides a method for fabricating the display panel above. As illustrated in FIG. 7, the method for fabricating the display panel according to the embodiment of this disclosure can include the following steps.

The step S701 is to prepare the first substrate.

The step S702 is to form the plurality of pixels arranged in an array on the first substrate, where each pixel includes a plurality of sub-pixels in different colors.

The step S703 is to form the interference filters one-to-one corresponding to the sub-pixels on the light emitting sides of the sub-pixels, wherein the interference filters are configured to transmit light in narrow bands in the same colors as the corresponding sub-pixels.

The interference filters corresponding to the colors of light emitted from the sub-pixels are arranged on the light emitting sides of the sub-pixels so that the light in the narrow bands in the corresponding colors are transmitted, thus improving the saturation of the colors of the emitting light, extending the display color gamut of the display panel, and optimizing the display effect.

The display panel according to the embodiment of this disclosure can be a liquid crystal display panel, or can be an organic light-emitting diode display panel, and when the display panel is a liquid crystal display panel, the step S703 of forming the interference filters one-to-one corresponding to the sub-pixels on the light emitting sides of the sub-pixels specifically can include: preparing a second substrate; forming the interference filters corresponding to the sub-pixels in the different colors successively on the second substrate; aligning the second substrate formed with the interference filters with the first substrate so that the interference filters face the corresponding sub-pixels.

When the display panel is an organic light-emitting diode display panel, the step S703 of forming the interference filters one-to-one corresponding to the sub-pixels on the light emitting sides of the sub-pixels specifically can include: preparing a protective cover plate; and forming the interference filters corresponding to the sub-pixels in the different colors successively on the protective cover plate; and arranging the protective cover plate formed with the interference filters on the light emitting sides of the sub-pixels so that the interference filters face the corresponding sub-pixels.

When the organic light-emitting diodes are encapsulated using a thin film, then the step S703 of forming the interference filters one-to-one corresponding to the sub-pixels on the light emitting sides of the sub-pixels specifically can include: covering light-emitting elements of the pixels with an encapsulation layer; and forming the interference filters corresponding to the sub-pixels in the different colors successively on the encapsulation layer.

Here the areas where the formed interference filters are located correspond to the areas where the sub-pixels are located. In the liquid crystal display panel, the sub-pixels are located areas defined by gate lines and data lines; and in the organic light-emitting diode display panel, the sub-pixels are located in the areas where the anodes in the organic light-emitting diode elements are located. In a fabrication process, orthographic projections of the interference filters on the first substrate cover orthographic projections of the sub-pixels corresponding thereto on the first substrate, so that the light emitted from the corresponding sub-pixels can be filtered effectively by the interference filters.

Specifically the interference filters in the same color can be formed in the same patterning process, and the interference filters in different colors correspond to the sub-pixels at different positions, so the interference filters in the different colors are formed successively; and for example, when the display panel includes red, green, and blue sub-pixels, then the respective interference filters can be formed in such order that firstly the interference filters corresponding to the red sub-pixels, then the interference filters corresponding to the green sub-pixels, and lastly the interference filters corresponding to the blue sub-pixels can be formed.

For example, a specific fabrication flow of the interference filters corresponding to the sub-pixels in some color (red, green, blue, etc.) will be described in details.

Figure 8:
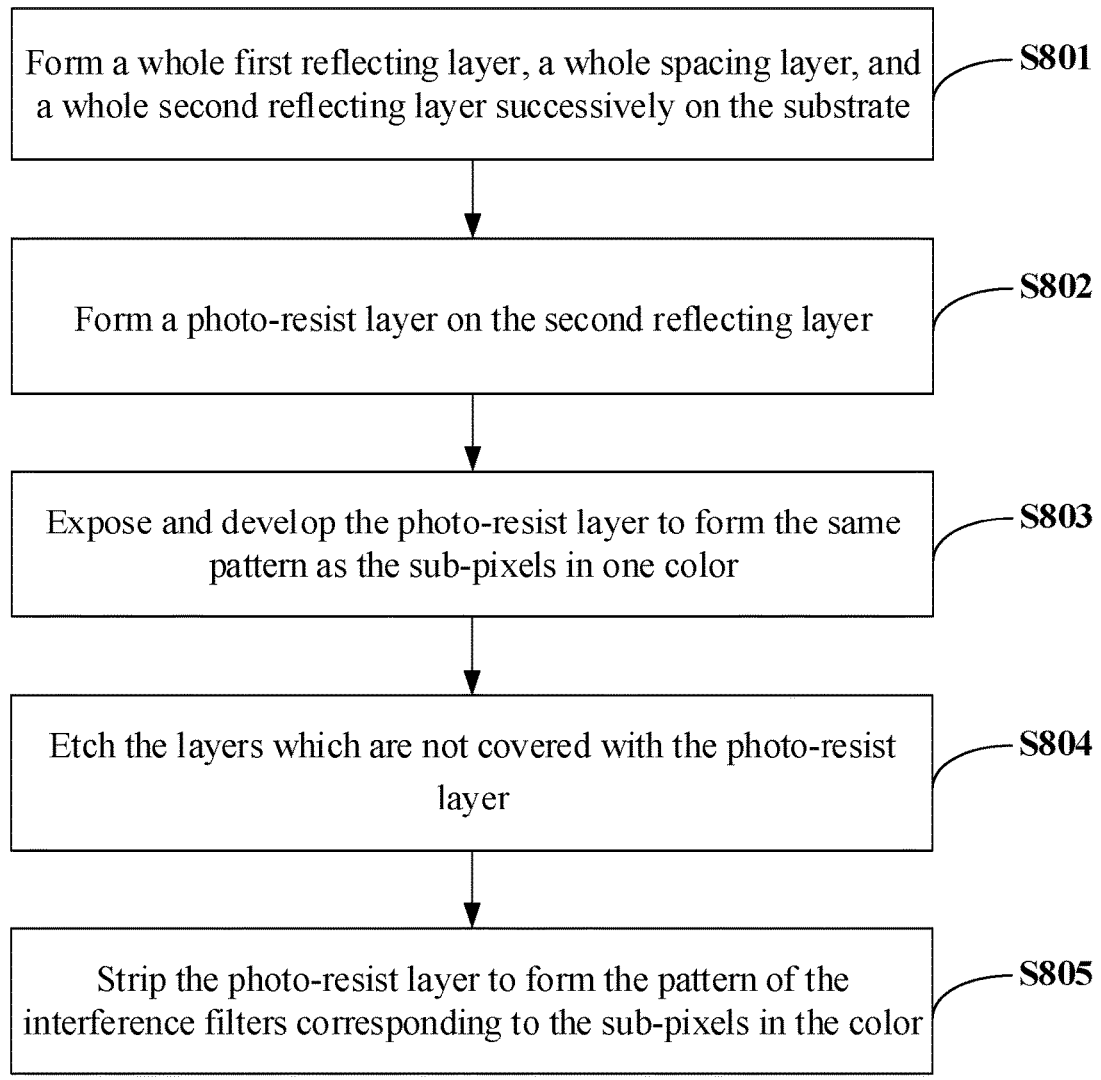
FIG. 8 is a flow chart of a method for fabricating a display panel according to another embodiment of this disclosure.

As illustrated in FIG. 8, the interference filters corresponding to the sub-pixels in the same color can be formed in the following steps.

The step S801 is to form a whole first reflecting layer, a whole spacing layer, and a whole second reflecting layer successively.

The step S802 is to form a photo-resist layer on the second reflecting layer.

The step S803 is to expose and develop the photo-resist layer to form the same pattern as the sub-pixels in one of the colors.

The step S804 is to etch the layers which are not covered with the photo-resist layer. The step S805 is to strip the photo-resist layer to form the pattern of the interference filters corresponding to the sub-pixels in the color.

Figure 9A:
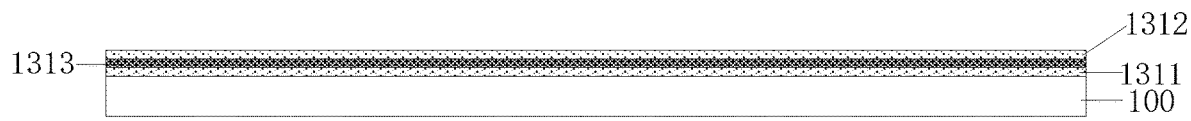
FIG. 9a to FIG. 9e are corresponding schematic diagrams of the display panel fabricated in the respective steps in FIG. 8.
Figure 9B:
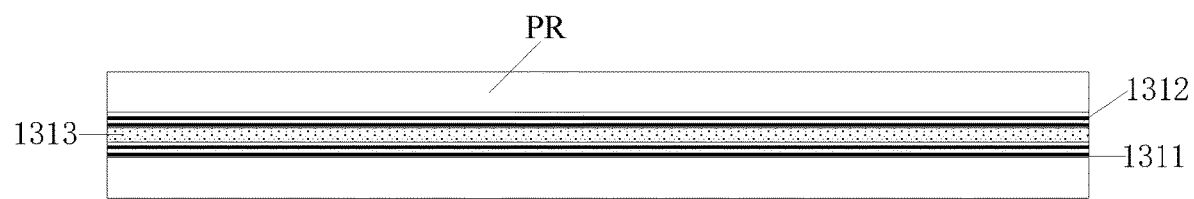
Figure 9C:
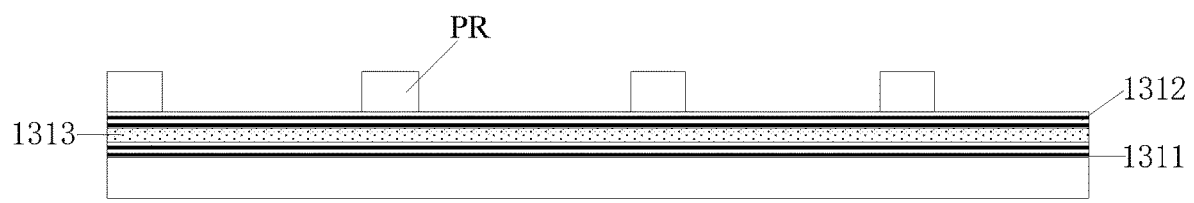
Figure 9D:
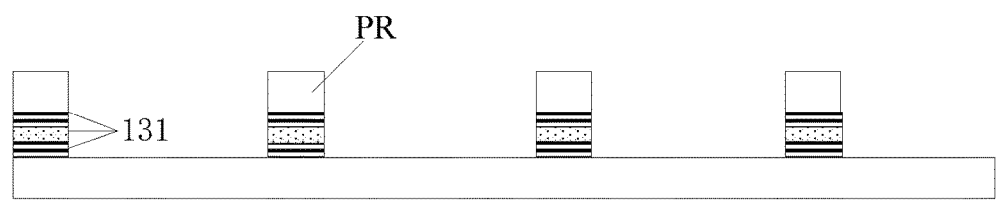
Figure 9E:

The interference filters can be formed on the substrate (a second substrate or an encapsulation cover plate) as described above by way of an example, and the interference filters can be formed in the same steps on an encapsulation layer. Specifically as illustrated in FIG. 9a, a whole first reflecting layer 1311, a whole spacing layer 1313, and a whole second reflecting layer 1313 are covered successively on the substrate 100 to constitute a substrate structure of the interference filters. Then as illustrated in FIG. 9b, a whole photo-resist layer PR is covered on the second reflecting layer 1312, where the photo-resist layer can be a negative photo-resist layer in the embodiment of this disclosure, and a mask is arranged on the negative photo-resist layer, and the negative photo-resist layer is exposed and developed to thereby form the same pattern of the photo-resist layer as the sub-pixels in one color as illustrated in FIG. 9c. Thereafter the exposed layers of the interference filters are etched in a dry etching process as illustrated in FIG. 9d. Lastly the photo-resist layer PR is striped to form the interference filters one-to-one corresponding to the sub-pixels in the color as illustrated in FIG. 9e. The interference filters corresponding to the sub-pixels in the other colors can be formed in the same process, so a repeated description thereof will be omitted here.

In the display panel, the method for fabricating the display panel, and the display device according to the embodiments of this disclosure, the display panel includes: a first substrate, and a plurality of pixels in an array on the first substrate, where each pixel includes a plurality of sub-pixels in different colors, and interference filters one-to-one corresponding to the sub-pixels are arranged on light emitting sides of the sub-pixels, and configured to transmit light in narrow bands in the same colors as the corresponding sub-pixels. The interference filters corresponding to the colors of light emitted from the sub-pixels are arranged on the light emitting sides of the sub-pixels, so that the light in the narrow bands in the corresponding colors are transmitted, thus improving the saturation of the colors of the emitted light, extending the display color gamut of the display panel, and optimizing the display effect.

Although the preferred embodiments of the disclosure have been described, those skilled in the art benefiting from the underlying inventive concept can make additional modifications and variations to these embodiments. Therefore the appended claims are intended to be construed as encompassing the preferred embodiments and all the modifications and variations coming into the scope of the disclosure.

Evidently those skilled in the art can make various modifications and variations to the disclosure without departing from the spirit and scope of the disclosure. Thus the disclosure is also intended to encompass these modifications and variations thereto so long as the modifications and variations come into the scope of the claims appended to the disclosure and their equivalents.

The invention claimed is:

1. A display panel, comprising:
    a first substrate;
    a plurality of pixels in an array on the first substrate, wherein at least one of the pixels comprises at least two sub-pixels in different colors; and
    interference filters one-to-one corresponding to the sub-pixels on light emitting sides of the sub-pixels, and configured to transmit light in narrow bands in same colors as the corresponding sub-pixels;
    wherein the interference filter comprises two reflecting layers opposite to each other and a spacing layer between the two reflecting layers;
    each of the two reflecting layers comprises a first dielectric layer and a second dielectric layer stacked alternately, and a refractive index of the first dielectric layer is lower than a refractive index of the second dielectric layer;
    the spacing layer, and a center wavelength of the interference filter satisfy the following relationship:

$$nd = x\frac{\lambda_0}{2};$$

wherein n is the refractive index of the spacing layer, d is a geometrical thickness of the spacing layer, $\lambda_0$ is the center wavelength of the interference filter, and x is an integer equal to or more than 1; and
    the refractive index of the spacing layer is equal to the refractive index of the first dielectric layer, a pass band of the interference filter satisfies the following relationship:

$$\frac{\Delta\lambda}{\lambda_0} = \frac{4n_0 n_L^{2q}(n_H - n_L)}{m\pi n_H^{2q-1}(n_H - n_L + n_L/m)};$$

wherein $2\Delta\lambda$ is a full width at half maximum of the interference filter, $n_0$ is the refractive index of a medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

2. The display panel according to claim 1, wherein the interference filter is a band-pass filter with a pass band below 5% of a center wavelength thereof.

3. The display panel according to claim 1, wherein a material of the first dielectric layer is silicon oxide, and a material of the second dielectric layer is silicon nitride.

4. The display panel according to claim 1, wherein the display panel is a liquid crystal display panel, and the liquid crystal display panel further comprises a second substrate opposite to the first substrate, wherein the interference filters one-to-one corresponding to the sub-pixels are on a side of the second substrate facing the first substrate.

5. The display panel according to claim 1, wherein the display panel is an organic light-emitting diode display panel.

6. The display panel according to claim 5, wherein the organic light-emitting diode display panel further comprises a protective cover plate which is opposite to the first substrate, wherein the interference filters one-to-one corresponding to the sub-pixels are on a side of the protective cover plate facing the first substrate.

7. The display panel according to claim 5, wherein the organic light-emitting diode display panel further comprises a light-emitting element encapsulation layer on the first substrate, wherein the interference filters one-to-one corresponding to the sub-pixels are on a side of the encapsulation layer away from the first substrate.

8. A display device, comprising the display panel according to claim 1.

9. A method for fabricating a display panel, comprising:
    preparing a first substrate;
    forming a plurality of pixels in an array on the first substrate, wherein at least one of the pixels comprises a plurality of sub-pixels in different colors; and
    forming interference filters one-to-one corresponding to the sub-pixels on light emitting sides of the sub-pixels, wherein the interference filters are configured to transmit light in narrow bands in same colors as the corresponding sub-pixels;
    wherein the interference filter comprises two reflecting layers opposite to each other and a spacing layer between the two reflecting layers;
    each of the two reflecting layers comprises a first dielectric layer and a second dielectric layer stacked alternately, and a refractive index of the first dielectric layer is lower than a refractive index of the second dielectric layer;
    the spacing layer, and a center wavelength of the interference filter satisfy the following relationship:

$$nd = x\frac{\lambda_0}{2};$$

wherein n is the refractive index of the spacing layer, d is a geometrical thickness of the spacing layer, $\lambda_0$ is the center wavelength of the interference filter, and x is an integer equal to or more than 1; and
    the refractive index of the spacing layer is equal to the refractive index of the first dielectric layer, a pass band of the interference filter satisfies the following relationship:

$$\frac{\Delta\lambda}{\lambda_0} = \frac{4n_0 n_L^{2q}(n_H - n_L)}{m\pi n_H^{2q-1}(n_H - n_L + n_L/m)};$$

wherein $2\Delta\lambda$ is a full width at half maximum of the interference filter, $n_0$ is the refractive index of a medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

10. The method according to claim 9, wherein when the display panel is a liquid crystal display panel, forming the interference filters one-to-one corresponding to the sub-pixels on the light emitting sides of the sub-pixels comprises:

preparing a second substrate;
forming the interference filters corresponding to the sub-pixels in different colors successively on the second substrate; and
aligning the second substrate formed with the interference filters with the first substrate so that the interference filters face the corresponding sub-pixels.

11. The method according to claim 9, wherein when the display panel is an organic light-emitting diode display panel, forming the interference filters one-to-one corresponding to the sub-pixels on the light emitting sides of the sub-pixels comprises:
preparing a protective cover plate;
forming the interference filters corresponding to the sub-pixels in different colors successively on the protective cover plate; and
arranging the protective cover plate formed with the interference filters on the light emitting sides of the sub-pixels so that the interference filters face the corresponding sub-pixels.

12. A display panel, comprising:
a first substrate;
a plurality of pixels in an array on the first substrate, wherein at least one of the pixels comprises at least two sub-pixels in different colors; and
interference filters one-to-one corresponding to the sub-pixels on light emitting sides of the sub-pixels, and configured to transmit light in narrow bands in same colors as the corresponding sub-pixels;
wherein the interference filter comprises two reflecting layers opposite to each other and a spacing layer between the two reflecting layers;
each of the two reflecting layers comprises a first dielectric layer and a second dielectric layer stacked alternately, and a refractive index of the first dielectric layer is lower than a refractive index of the second dielectric layer;
the spacing layer, and a center wavelength of the interference filter satisfy the following relationship:

$$nd = x\frac{\lambda_0}{2};$$

wherein n is the refractive index of the spacing layer, d is a geometrical thickness of the spacing layer, $\lambda_0$ is the center wavelength of the interference filter, and x is an integer equal to or more than 1; and
the refractive index of the spacing layer is equal to the refractive index of the second dielectric layer, a pass band of the interference filter satisfies the following relationship:

$$\frac{\Delta\lambda}{\lambda_0} = \frac{4n_0 n_L^{2q-1}(n_H - n_L)}{m\pi n_H^{2q}(n_H - n_L + n_L/m)}.$$

wherein $2\Delta\lambda$ is a full width at half maximum of the interference filter, $n_0$ is the refractive index of a medium contacted with the interference filter, $n_L$ is the refractive index of the first dielectric layer, $n_H$ is the refractive index of the second dielectric layer, m is an interference order of the interference filter, q is the number of second dielectric layers in the reflecting layer, and $\lambda_0$ is the center wavelength of the interference filter.

13. The display panel according to claim 12, wherein the interference filter is a band-pass filter with a pass band below 5% of a center wavelength thereof.

14. The display panel according to claim 12, wherein a material of the first dielectric layer is silicon oxide, and a material of the second dielectric layer is silicon nitride.

15. The display panel according to claim 12, wherein the display panel is a liquid crystal display panel, and the liquid crystal display panel further comprises a second substrate opposite to the first substrate, wherein the interference filters one-to-one corresponding to the sub-pixels are on a side of the second substrate facing the first substrate.

16. The display panel according to claim 12, wherein the display panel is an organic light-emitting diode display panel.

17. The display panel according to claim 16, wherein the organic light-emitting diode panel further comprises a protective cover plate which is opposite to the first substrate, wherein the interference filters one-to-one corresponding to the sub-pixels are on a side of the protective cover plate facing the first substrate.

18. The display panel according to claim 17, wherein the organic light-emitting diode display panel further comprises a light-emitting element encapsulation layer on the first substrate, wherein the interference filters one-to-one corresponding to the sub-pixels are on a side of the encapsulation layer away from the first substrate.

19. A display device, comprising the display panel according to claim 12.

20. A method for fabricating the display panel according to claim 12, comprising:
preparing the first substrate;
forming the plurality of pixels in the array on the first substrate, wherein at least one of the pixels comprises at least two sub-pixels in different colors; and
forming the interference filters one-to-one corresponding to the sub-pixels on light emitting sides of the sub-pixels, wherein the interference filters are configured to transmit light in narrow bands in same colors as the corresponding sub-pixels.

* * * * *